United States Patent
Nagaishi

(10) Patent No.: US 6,263,219 B1
(45) Date of Patent: Jul. 17, 2001

(54) SQUID FORMED ON A SAPPHIRE SUBSTRATE AND METHOD FOR MANUFACTURING THE SAME

(75) Inventor: Tatsuoki Nagaishi, Itami (JP)

(73) Assignee: Sumitomo Electric Industries, Inc., Osaka (JP)

( * ) Notice: Subject to any disclaimer, the term of this patent is extended or adjusted under 35 U.S.C. 154(b) by 0 days.

(21) Appl. No.: 09/275,187

(22) Filed: Mar. 23, 1999

(30) Foreign Application Priority Data

Mar. 23, 1998 (JP) .................................. 10-094057

(51) Int. Cl.$^7$ .................................. H01L 39/22
(52) U.S. Cl. .................. 505/162; 505/238; 505/701; 427/62; 428/930; 257/33
(58) Field of Search ................... 505/162, 701, 505/238; 428/930; 427/62; 257/33

(56) References Cited

FOREIGN PATENT DOCUMENTS 0 545 815 A2  6/1993  (EP) .

OTHER PUBLICATIONS

Boikov et al, J. Appl. Phys. 81(7) pp. 3232–3236, Apr. 1997.*
Kotelyanski et al, Inst. Phys. Conf. Ser. 148 vol. 2, no page numbers (Abstract), 1995.*
Laibowitz et al, Appl. Phys. lett. 64(2), pp. 247–249, Jan. 1994.*
Yuan C. W. et al. "Step edge YBa/sub 2/Cu/sub 3/O/sub 7–delta/DC SQUIDs on sapphire substrates", *Applied Physics Letters*, May 18, 1992, USA, vol. 60, No. 20, pp. 2552–2554.

* cited by examiner

Primary Examiner—Shrive Beck
Assistant Examiner—Bret Chen
(74) Attorney, Agent, or Firm—Foley & Lardner

(57) ABSTRACT

A SQUID made of an oxide superconducting thin film is formed on a sapphire substrate. $CeO_2$ film, $RBa_2Cu_3O_{7-x}$ film ("R" indicates a rare earth element chosen among a group formed of Yb, Er, Ho, Y, Dy, Gd, Eu, Sm and Nd) and $SrTiO_3$ film are deposited on the substrate top of the sapphire substrate successively. Furthermore, an oxide superconducting thin film to form a SQUID is deposited on the $SrTiO_3$ film.

9 Claims, 2 Drawing Sheets

SQUID FORMED ON A SAPPHIRE SUBSTRATE AND METHOD FOR MANUFACTURING THE SAME

DETAILED DESCRIPTION OF THE INVENTION

1. Field of the Invention

The present invention relates to a SQUID. The present invention is related to a configuration of a SQUID and a method for manufacturing the same. More specifically, the present invention is related to a SQUID formed of an oxide superconducting thin film on a sapphire substrate.

2. Description of Related Art

Generally, a SQUID comprises a circular current road for superconducting current, including one or two Josephson junctions. The SQUID related to the present invention is a SQUID formed of an oxide superconducting thin film, in particular one that has the composition "$RBa_2Cu_3O_{7-x}$ ("R" indicates a rare earth element chosen among a group formed a Yb, Er, Ho, Y, Dy, Gd, Eu, Sm and Nd)". The oxide superconducting thin film of this kind has high critical temperature and is to be effective by cooling by liquid nitrogen.

However, a specified crystal structure is required so that the oxide thin film obtains a superconducting state. Accordingly, in most case, an oxide superconducting thin film is formed on a MgO single crystal substrate or $SrTiO_3$ single crystal substrate. These substrate materials have well matching of cell to the oxide superconducting thin film and preferable arrangement of crystal is provided.

However, MgO single crystal substrate and $SrTiO_3$ single crystal substrate are very expensive, and, these substrates having a large area are hard to obtain. As the result, SQUID formed of an oxide superconducting thin film tends to be expensive.

On the other hand, Si single crystal substrate or sapphire substrate is obtained easily and cheap. However, an oxide superconducting thin film is hard to be formed on them.

SUMMARY OF THE INVENTION

The problems mentioned above are solved by the present invention. In a manufacture method of the present invention, sapphire substrate is used as a substrate material and oxide superconducting thin film of high quality is formed at the same time.

A characteristic of the present invention is not simple displacement of substrate material. Namely, when a $SrTiO_3$ film is formed directly on a sapphire substrate, $SrTiO_3$ film (100) is never formed. However, the method according to the present invention is obtained by a 3-phase production process.

As the first process, a $CeO_2$ (100) film is formed on the sapphire substrate. As the second process forms, a $RBa_2Cu_3O_{7-x}$(001) film ("R" indicates a rare earth element chosen among a group formed of Yb, Er, Ho, Y, Dy, Gd, Eu, Sm and Nd) is formed oil the $CeO_2$ (100) film. As the third process, $SrTiO_3$ (100) film is formed on the $RBa_2Cu_3O_{7-x}$ (001) film. At last, the oxide superconducting thin film to be a SQUID is formed on this $SrTiO_3$ (100) film.

Such processes bring the following effect.

Each film sticks well mutually. The oxide superconducting thin film can be formed on a $SrTiO_3$ film that is oriented (100). Accordingly, high quality oxide superconducting thin film is provided on a sapphire substrate. The quality of the oxide superconducting thin film is equal to the one of an oxide superconducting thin film on MgO substrate or $SrTiO_3$ substrate. Acquisition of a sapphire substrate is easy, as opposed to MgO substrate or $SrTiO_3$ substrate.

Furthermore, an advantage is not simply confined to reduction of material cost. A sapphire substrate having a large area is readily available. Accordingly, several SQUIDs can be formed on one substrate and production of SQUID becomes possible in large quantities.

In other words, high performance and inexpensive SQUID can be supplied by the present invention.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Figure 1A:
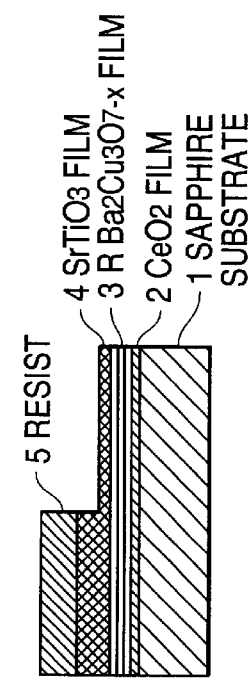
FIG. 1A–1H shows diagrammatic sectional views for illustrating each process of the method of the present invention.
Figure 1B:
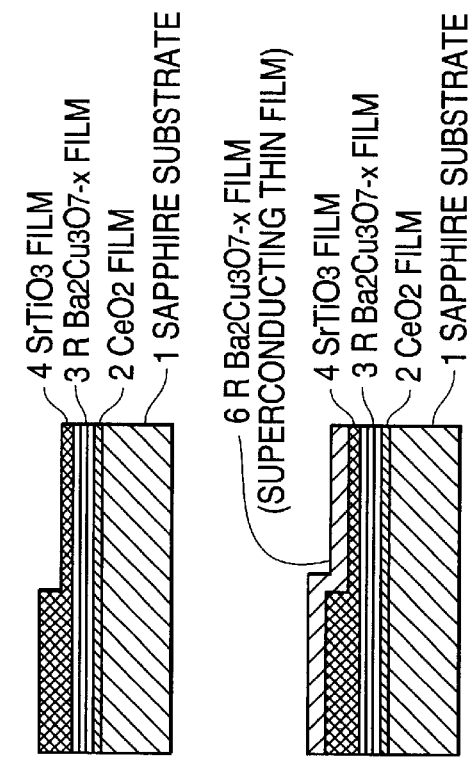

At first, as shown in FIG. 1A, $CeO_2$ film 2 is deposited on the whole surface of the sapphire substrate 1 having a flat principal surface. As shown in FIG. 1B, a $RBa_2Cu_3O_{7-x}$ ("R" indicates a rare earth element chosen among a group formed of Yb, Er, Ho, Y, Dy, Gd, Eu, Sm and Nd) film 3 and a $SrTiO_3$ film 4 are deposited on the $CeO_2$ film 2 successively. Each process of these series processes can be done by pulsed laser deposition, for example.

Successively, the surface of the $SrTiO_3$ film is processed to form a physical step by the following process.

Figure 1C:
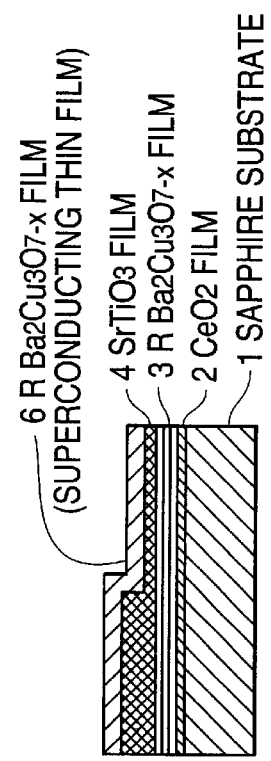
Figure 1D:
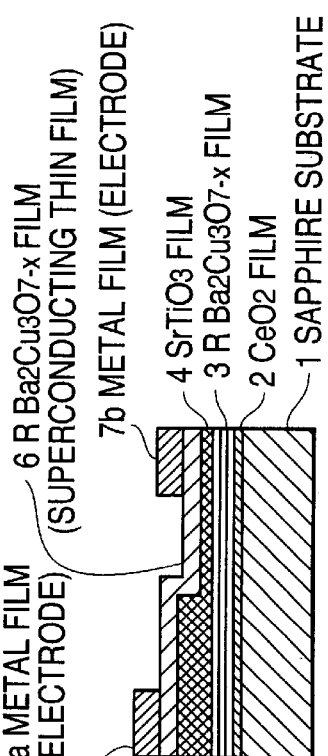
Figure 1E:
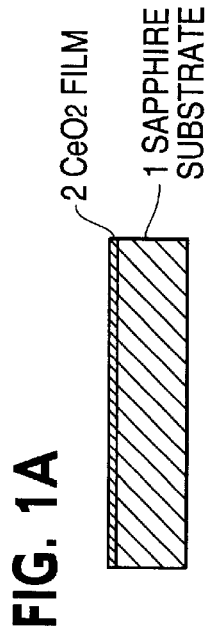
Figure 1F:
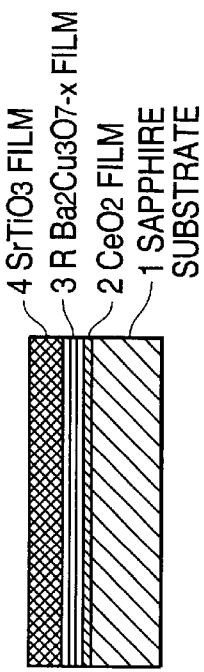

At first, as shown in FIG. 1C, resist 5 is deposited on the whole surface of the $SrTiO_3$ film 4. Successively, as shown in FIG. 1D, after a part of this resist has been exposed, an unnecessary part of the resist is removed. As shown in FIG. 1E, the resist 5 left is used as a mask while a part of the $SrTiO_3$ film 4 is removed by Ar ion-milling. Finally, as shown in FIG. 1F, the resist layer 5 left on the $SrTiO_3$ film 4 is removed with an appropriate solvent. A kind of solvent is selected according to a kind of resist for example, a solvent can be an acetone.

Then, after the above process, a physical step is formed on the surface of the $SrTiO_3$ film 4. This $SrTiO_3$ film 4 becomes a substrate of an oxide superconducting thin film.

Figure 1G:
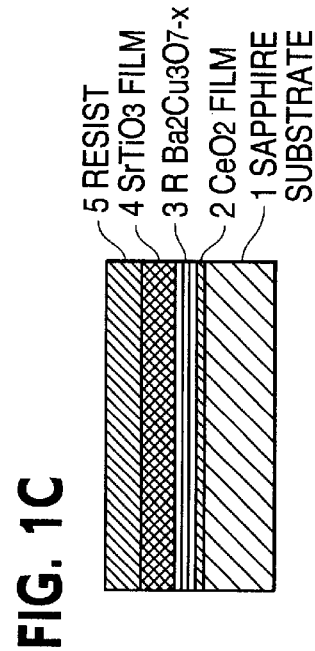

As shown in FIG. 1G, an oxide superconducting thin film 6 is deposited on the $SrTiO_3$ film 4. This oxide superconducting thin film 6 has a composition $RBa_2Cu_3O_{7-x}$. ("R" indicates a rare earth element chosen among a group formed of Yb, Er, Ho, Y, Dy, Gd, Eu, Sm and Nd).

Figure 1H:
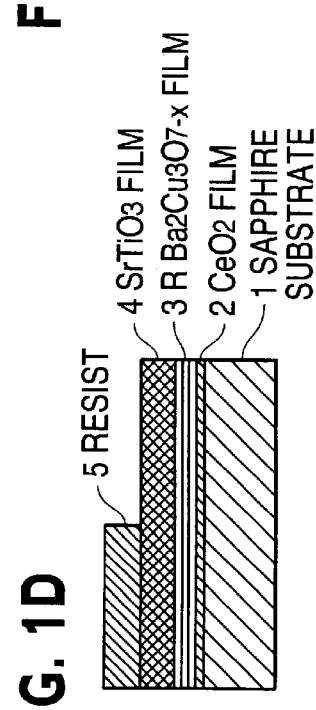

Furthermore, as shown in FIG. 1H, a pair of electrodes 7a, 7b is formed on the oxide superconducting thin film 6. The electrodes 7a, 7b are formed by using a metal mask, for example, and formed of Au membrane and Ag membrane laminating each other, for example.

Finally, the oxide superconducting thin film 6 is processed with fine precision at the point as same as the step. The oxide superconducting thin film processed forms a Josephson junction. This minute processing can be performed by standard photolithography technology.

Thus, the process of manufacturing the SQIUD is completed in this way. Orientation of each film is shown in Table 1.

TABLE 1

| $CeO_2$ | $RBa_2Cu_3O_{7-x}$ | $SrTiO_3$ |
|---|---|---|
| (100) | (001) | (100) |

Applicant made a SQUID by the method mentioned above. Deposition of each film was done by laser beam vapor deposition. Common condition is shown in Table 2 and individual condition is shown in Table 3.

TABLE 2

| Substrate and distance of target | 100 mm |
|---|---|
| Energy density of laser beam | 2.5 J/cm$^2$ |
| Exposure area | 2 mm × 4 mm |

TABLE 3

| Composition of film | $CeO_2$ | $RBa_2Cu_3O_{7-x}$ | $SrTiO_3$ |
|---|---|---|---|
| temperature of substrate (° C.) | 680 | 700 | 700 |
| oxygen pressure (mTorr) | 10 | 400 | 100 |
| film thickness (nm) | 20 | 400 | 300 |

It was identified by a test that the condition mentioned above is effective when a chemical element is selected as an element that corresponds to a rare earth element "R". ("R" indicates a rare earth element chosen among a group formed Yb, Er, Ho, Y, Dy, Gd, Eu, Sm and Nd)

The height of the step formed on the SrTiO$_3$ film was 160 nm. Thickness of the oxide superconducting thin film was 220 nm. The width of the superconducting thin film at the Josephson junction was 5 µm. The configuration of the SQUID was 5 mm square. The inductance of the SQUID was 40 pH.

Current/voltage characteristic and magnetic field/voltage characteristic of this SQUID provided were measured by a quadrupole method. As a result, 2Ic was 100 µA, and current potential characteristic of RSJ type was observed. These results show that the junction is a good one. Furthermore, width of voltage modulation by having a hanged magnetic field was more than 10 µV.

Then, applicant determined that the SQUID formed on the sapphire substrate worked as a magnetism sensor and confirmed good characteristics of the SQUID from these results.

Embodiment 2

Figure 2:
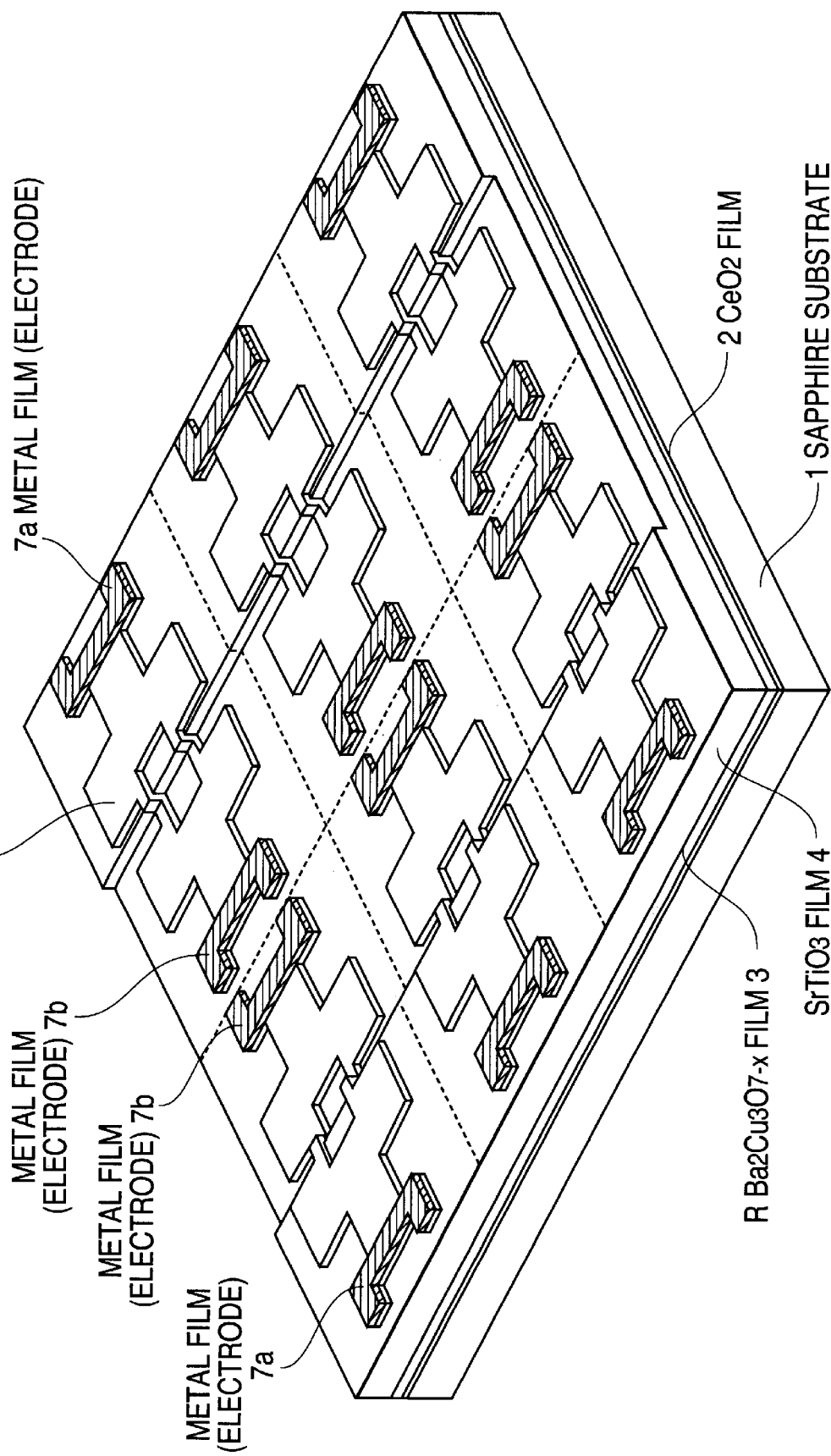
FIG. 2 shows a birdseye view of one of embodiments of the present invention.

Sapphire substrate having large sapphire is readily available. Accordingly, in a case that a sapphire substrate is used as a substrate for SQUID, as shown in FIG. 2, several SQUID can be put on one substrate 1. In this case, manufacture time for one SQUID is shortened. The dimension of each element shown in FIG. 2 is exaggerated so that characteristic of each element is easy to be understood. At the same time, in FIG. 2, the reference number given for each element is the same as one corresponding in FIG. 1.

What is claimed is:

1. A SQUID formed of an oxide superconducting thin film, comprising:

a CeO$_2$ film, a first RBa$_2$Cu$_3$O$_{7-x}$ film and a SrTiO$_3$ film successively formed on a sapphire substrate having a flat, planar surface; and a second RBa$_2$Cu$_3$O$_{7-x}$ film, where R indicates a rare earth element selected from the group consisting of Yb, Er, Ho, Y, Dy, Gd, Eu, Sm and Nd, wherein the second RBa$_2$Cu$_3$O$_{7-x}$ film is an oxide superconducting thin film and is formed to be a SQUID, and wherein the second RBa$_2$Cu$_3$O$_{7-x}$ film and the SrTiO$_3$ film each have a step formed on a top surface thereof.

2. A SQUID as recited in claim 1, wherein said CeO$_2$ film is a CeO$_2$ film oriented (100), said first RBa$_2$Cu$_3$O$_{7-x}$ film is a RBa$_2$Cu$_3$O$_{7-x}$ film oriented (001), and said SrTiO$_3$ film is a SrTiO$_3$ film oriented (100).

3. A SQUID as recited in claim 1, wherein the step formed on the top surface of the SrTiO$_3$ film has a height of approximately 160 nm.

4. A SQUID as recited in claim 3, wherein a thickness of the second RBa$_2$Cu$_3$O$_{7-x}$ film is approximately 220 nm.

5. A SQUID as recited in claim 1, wherein the sapphire substrate does not have any step formed on a top surface thereof.

6. A SQUID as recited in claim 5, wherein the CeO$_2$ film and the first RBa$_2$Cu$_3$O$_{7-x}$ film do not have any step formed on top surfaces thereof.

7. A SQUID formed of an oxide superconducting thin film, comprising:

a sapphire substrate having a flat top surface;

a CeO$_2$ film disposed on the flat top surface of the sapphire substrate, the CeO$_2$ film having a flat top surface;

a first RBa$_2$Cu$_3$O$_{7-x}$ film disposed on the flat top surface of the CeO$_2$ film, the first RBa$_2$Cu$_3$O$_{7-x}$ film having a flat top surface;

a SrTiO$_3$ film disposed on the flat top surface of the first RBa$_2$Cu$_3$O$_{7-x}$ film, the SrTiO$_3$ film having a stepped top surface; and a second RBa$_2$Cu$_3$O$_{7-x}$ film formed on the stepped top surface of the SrTiO$_3$ film, where R indicates a rare earth element selected from the group consisting of Yb, Er, Ho, Dy, Gd, Eu, Sm and Nd, the second RBa$_2$Cu$_3$O$_{7-x}$ film having a stepped top surface, wherein the second RBa$_2$Cu$_3$O$_{7-x}$ film is an oxide superconducting thin film and is formed to be a SQUID.

8. A SQUID as recited in claim 7, wherein the stepped top surface of the SrTiO$_3$ film is structured such that a first contiguous portion of the SrTiO$_3$ film has a greater thickness than a second contiguous portion of the SrTiO$_3$ film, and wherein a step is formed at a boudnary between the first and second contiguous portions of the SrTiO$_3$ film.

9. A SQUID as recited in claim 8, wherein the first contiguous portion is disposed to a left side of the second contiguous portion.

* * * * *